United States Patent [19]
Potter

[11] Patent Number: 6,087,854
[45] Date of Patent: Jul. 11, 2000

[54] HIGH SPEED LINE DRIVER WITH DIRECT AND COMPLEMENTARY OUTPUTS

[75] Inventor: Dale A. Potter, Beaverton, Oreg.

[73] Assignee: Lattice Semiconductor Corporation, Hillsboro, Oreg.

[21] Appl. No.: 09/145,793

[22] Filed: Sep. 2, 1998

[51] Int. Cl.[7] .................. H03K 19/0185; H03K 19/0948
[52] U.S. Cl. .................. 326/83; 326/17; 326/121
[58] Field of Search .................. 326/17, 83, 86, 326/121, 57–58

[56] References Cited

U.S. PATENT DOCUMENTS

| | | | |
|---|---|---|---|
| 4,672,243 | 6/1987 | Kirsch | 326/71 |
| 5,013,937 | 5/1991 | Aoki | 326/121 |
| 5,146,111 | 9/1992 | Ciraula et al. | 326/58 |
| 5,406,139 | 4/1995 | Sharpe-Geisler | 326/121 |

*Primary Examiner*—Jon Santamauro
*Attorney, Agent, or Firm*—Skjerven, Morrill, MacPherson, Franklin & Friel LLP

[57] ABSTRACT

An improved line driver is disclosed. In one embodiment, the line driver has three inverters and a pass gate. The first inverter has a first input terminal connected directly to the input line of the line driver. The first inverter also has an output terminal coupled to a first output line of the line driver. The second inverter has an output node coupled to a second output line of the line driver. The third inverter has a first input terminal connected directly to the input line of the line driver and an output terminal coupled to the input node of the second inverter. The pass gate has a second input terminal coupled to the input line of the line driver and an output terminal coupled to both the second input terminal of the first inverter and the second input terminal of the third inverter. The pass gate receives an enable signal at a first input terminal and provides a conduction path between the input line of the line driver and the output terminal of the pass gate in response to the enable signal. The first and third inverters each invert the input signal to generate an output signal when the pass gate passes the input signal through. The second inverter inverts the output signal of the third inverter again to generate the direct output signal of the line driver. The line driver has a low parasitic capacitance connected to the pass gate, thereby reducing the line driver signal switching delay.

20 Claims, 5 Drawing Sheets

HIGH SPEED LINE DRIVER WITH DIRECT AND COMPLEMENTARY OUTPUTS

TECHNICAL FIELD OF THE INVENTION

The present invention relates to digital circuitry, and in particular to a high speed line driver with direct and complementary outputs.

BACKGROUND OF THE INVENTION

In logic devices such as programmable logic arrays and programmable logic devices, line drivers are frequently used to drive signals on shared signal lines. In some instances, it is desirable for a line driver to drive a signal on one line and provide the complement of the signal on a second line. This is particularly useful in logic arrays in which each input signal is provided in inverted and noninverted forms for potential connection to the inputs of one or more logic gates.

In addition, it is useful for the line drivers in a logic array to respond to a global enable signal, which can disable all line drivers to prevent large power transients and noise caused by the unwanted switching of line drivers. The line drivers may therefore each include a pass gate which only provides a conduction path from the line driver input to the driving circuitry of the line driver if the line driver is enabled by the enable signal. However, when a line driver is enabled, the pass gate of the line driver may cause significant delay in the switching of the line driver input signal.

SUMMARY OF THE INVENTION

Therefore, a need has arisen for a line driver that addresses the disadvantages and deficiencies of the prior art. In particular, a need has arisen for a high speed line driver with direct and complementary outputs.

Accordingly, an improved line driver is disclosed. In one embodiment, the line driver receives an input signal on an input line. A first inverter has a first input terminal connected directly to the input line of the line driver. The first inverter also has an output terminal coupled to a first output line of the line driver. A second inverter has an output node coupled to a second output line of the line driver. A third inverter has a first input terminal connected directly to the input line of the line driver. The third inverter also has an output terminal coupled to the input node of the second inverter.

A pass gate has a second input terminal coupled to the input line of the line driver and an output terminal coupled to both the second input terminal of the first inverter and the second input terminal of the third inverter. The pass gate receives an enable signal at a first input terminal and provides a conduction path between the input line of the line driver and the output terminal of the pass gate in response to the enable signal.

The first and third inverters each invert the input signal to generate an output signal when the pass gate provides a conduction path between the input line of the line driver circuit and the output terminal of the pass gate. The second inverter inverts the output signal of the third inverter again to generate the noninverted (direct) output signal of the line driver.

A technical advantage of the present invention is that the parasitic capacitance connected to the output terminal of the line driver's pass gate is reduced. Another technical advantage of the present invention is that the signal switching delay caused by the pass gate is reduced. Yet another technical advantage is that the direct coupling of the first and third inverters to the line driver input line also reduces line driver switching delay. Still another technical advantage is that the reduction in signal switching delay requires only a few additional circuit components which do not significantly increase the size of the line driver circuit.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION OF THE INVENTION

Figure 1A:
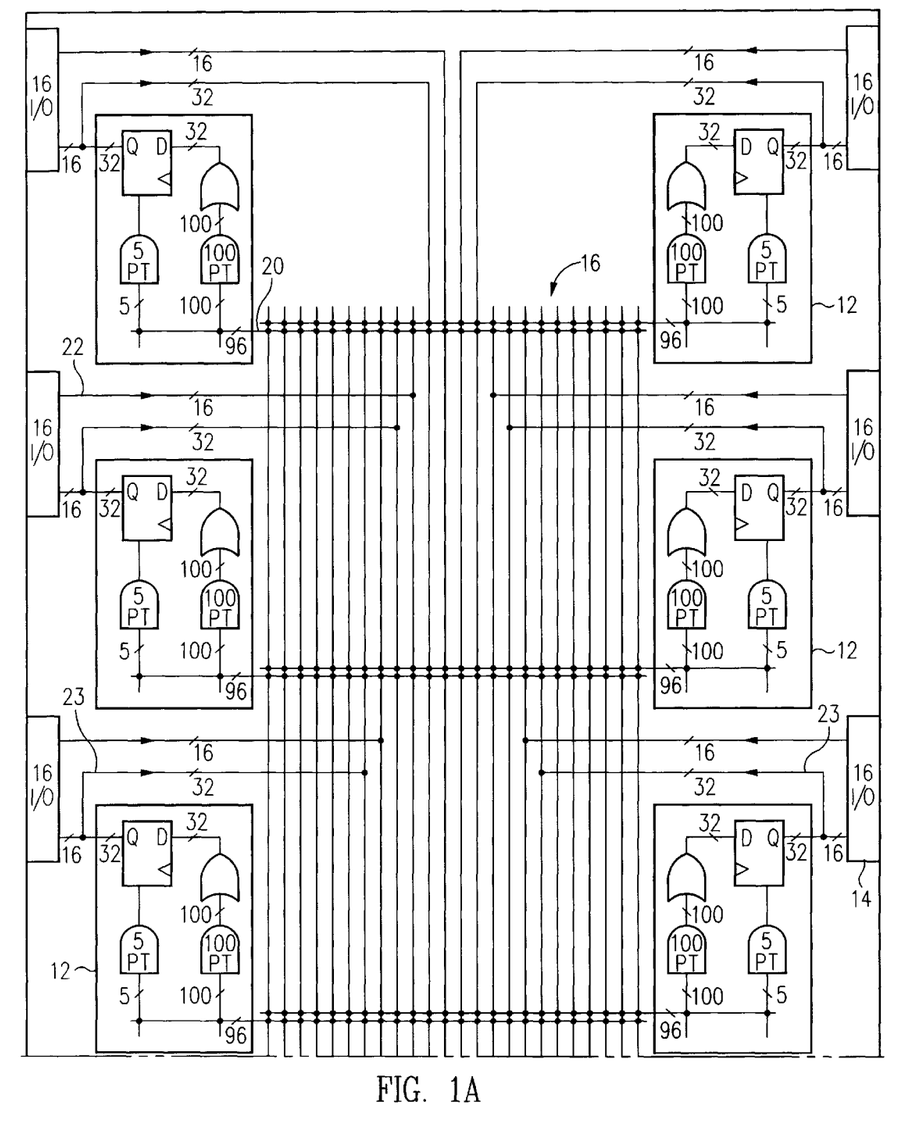
FIG. 1 is a block diagram of a programmable logic device implementing a line driver circuit in accordance with the present invention.
Figure 1B:
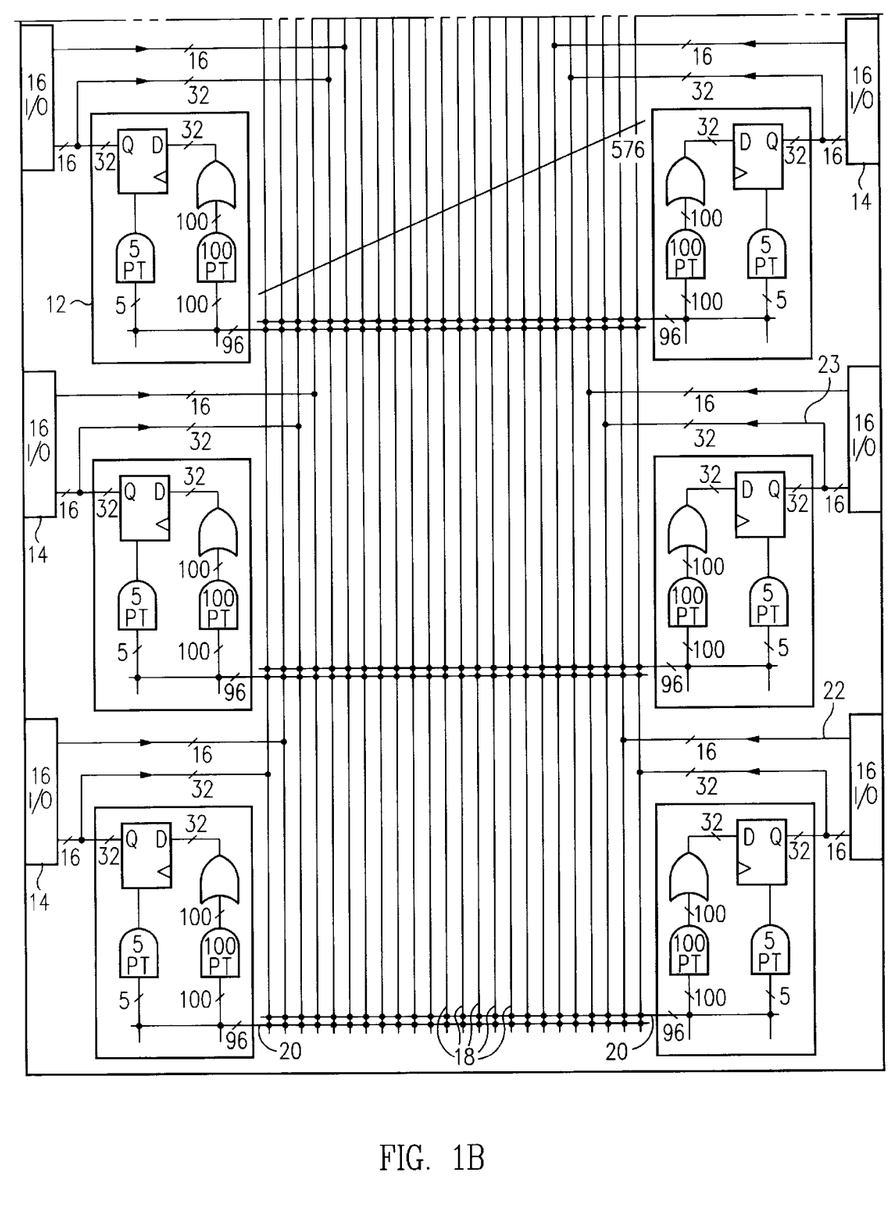
Figure 2A:
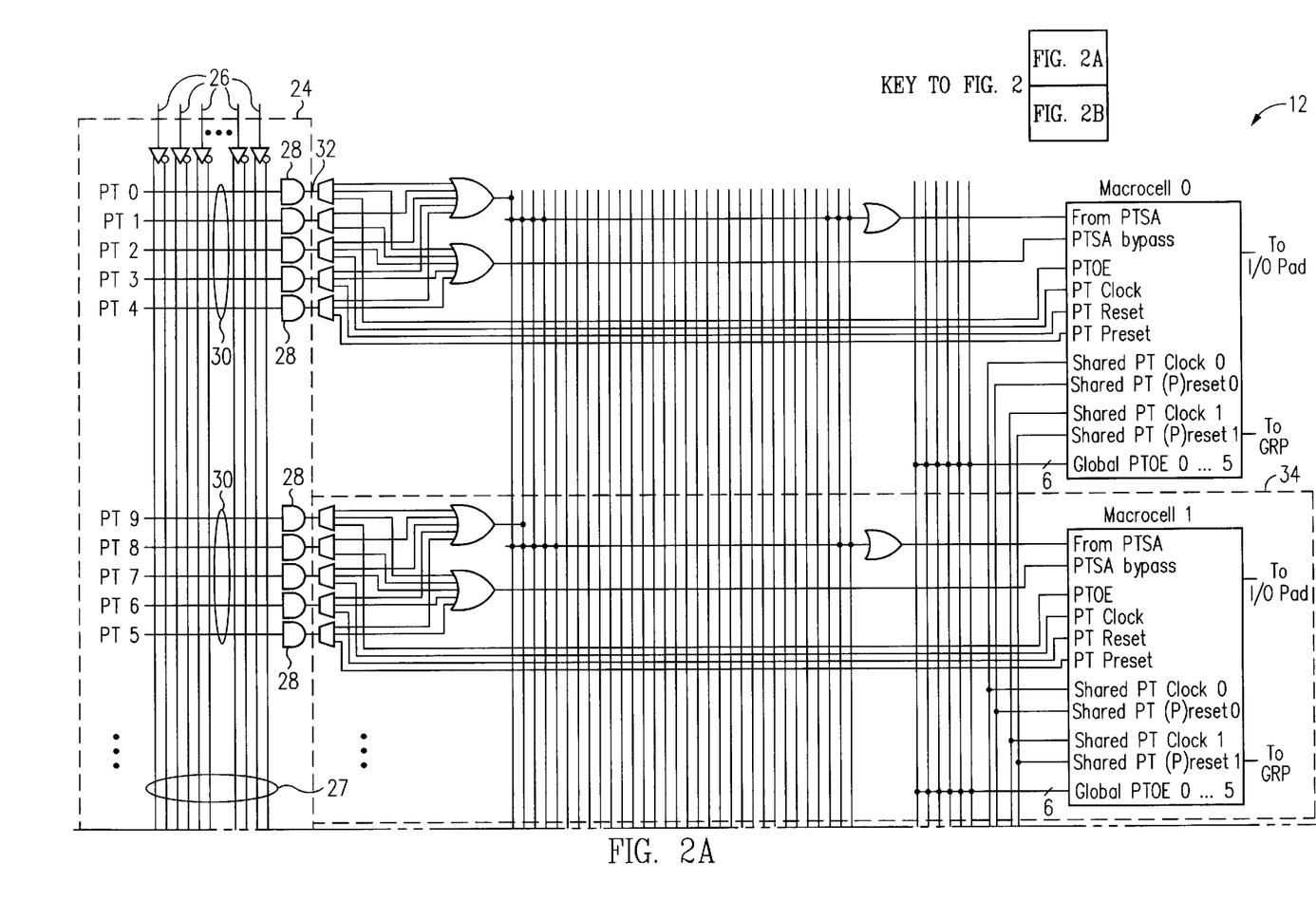
FIG. 2 is a block diagram of an exemplary generic logic block of the programmable logic device.
Figure 2B:
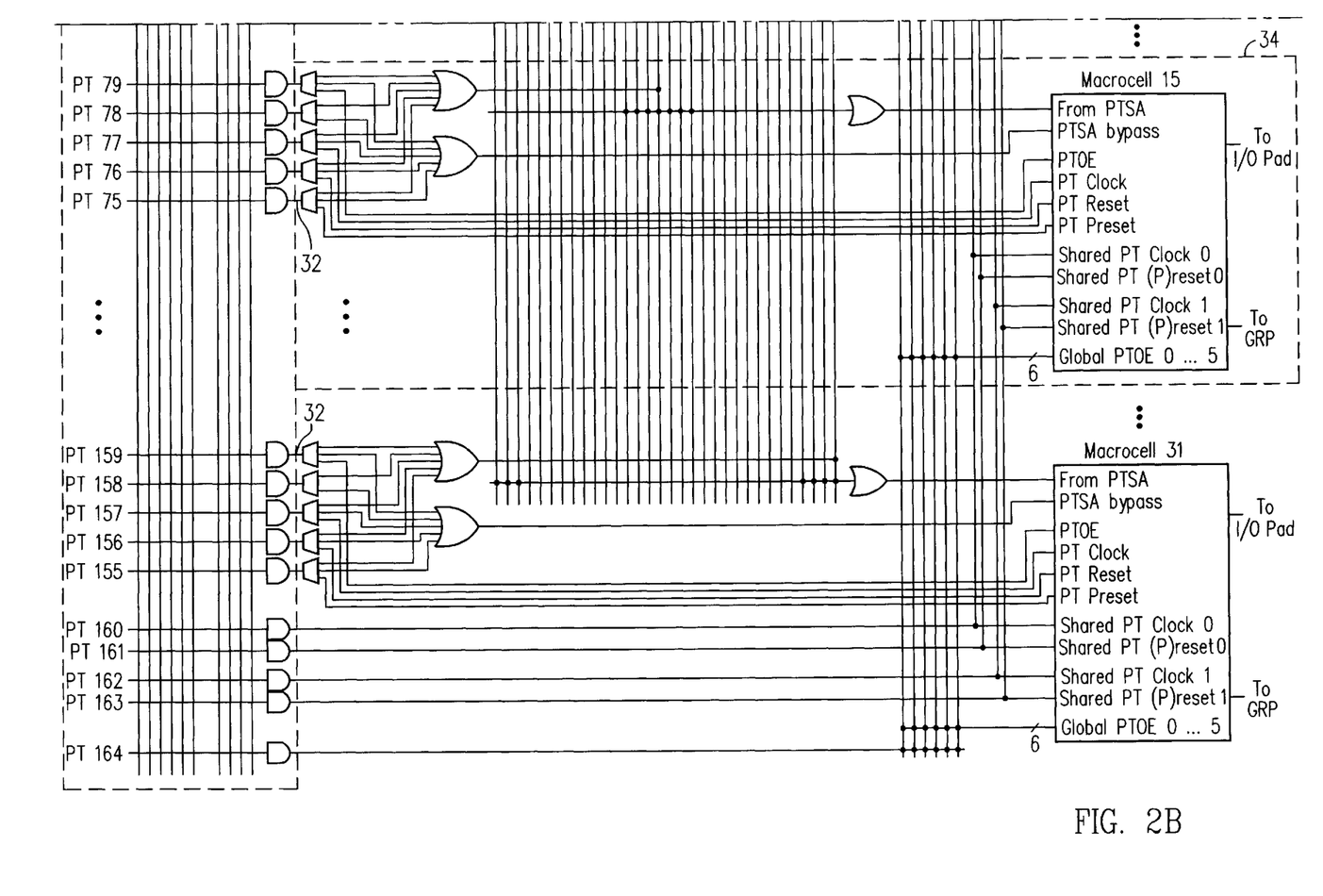
Figure 3:
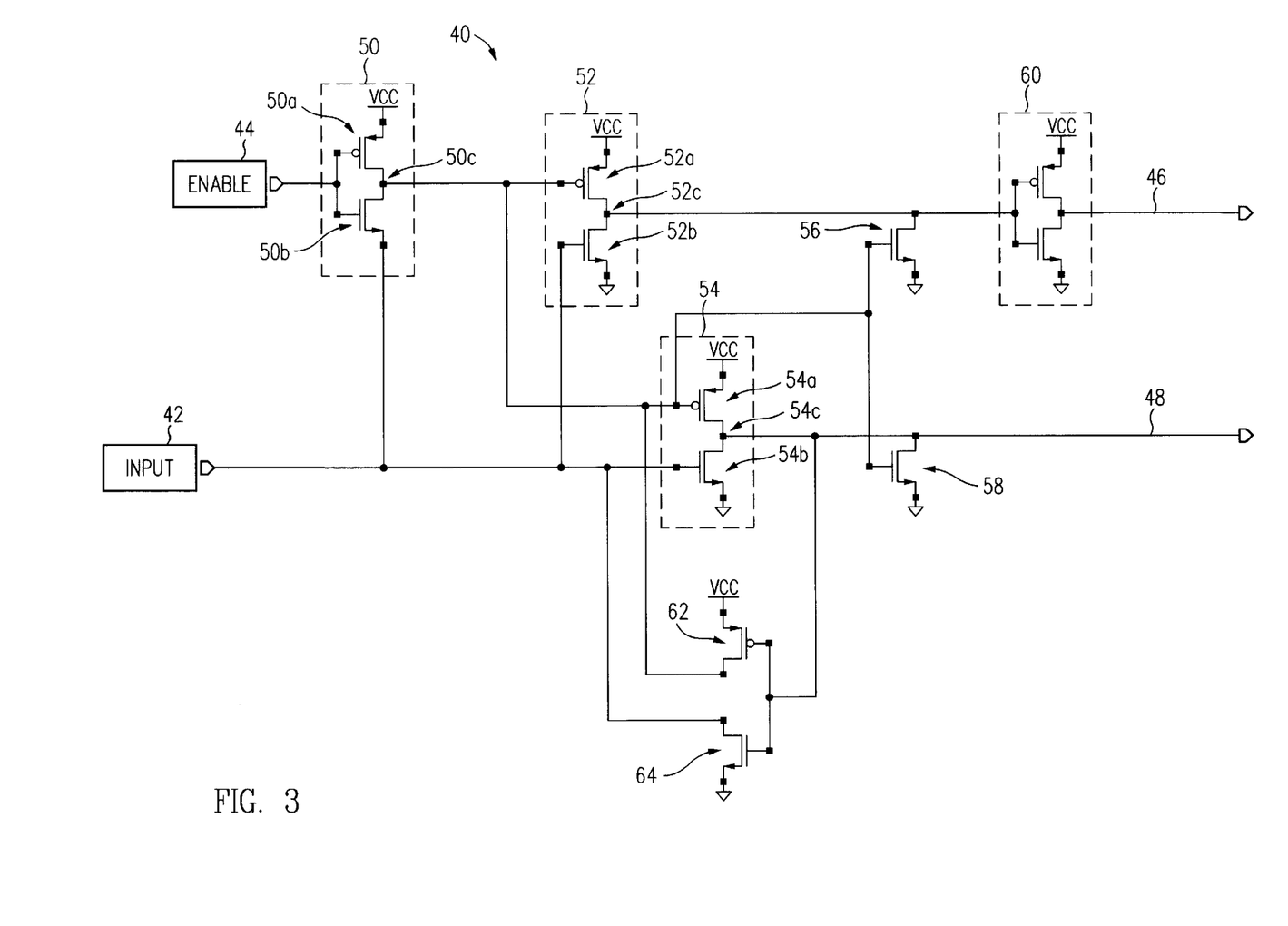
FIG. 3 is a schematic diagram of a line driver circuit in accordance with the present invention.

The preferred embodiments of the present invention and their advantages are best understood by referring to FIGS. 1, 2 and 3 of the drawings. Like numerals are used for like and corresponding parts of the various drawings.

Referring to FIG. 1, a programmable logic device 10 suitable for implementing a line driver circuit in accordance with the present invention is shown. Programmable logic device 10 includes twelve generic logic blocks 12. Each generic logic block 12 includes a set of logic gates which may be programmed to perform logic functions on input signals. Generic logic blocks 12 will be described more fully below.

Generic logic blocks 12 receive input signals and transmit output signals via I/O cells 14. I/O cells 14 are coupled to I/O pins (not shown) on programmable logic device 10. The type of I/O pins used for programmable logic device 10 depends on the type of packaging used for programmable logic device 10. For example, in a leaded package, the I/O pins may be leads extending from a lead frame, while in a ball grid array package, the pins would be solder connections on the bottom surface of the package. In this example, a ball grid array package is used to achieve the desired I/O pin density. Other standard packaging and pinout techniques may also be used.

A global routing pool 16 provides programmable communication lines for communication among generic logic blocks 12 and I/O cells 14. Global routing pool 16 includes 576 bus lines 18, each of which carries either a signal conducted from an I/O cell 14 by a line 22 or a signal conducted from a generic logic block 12 by a line 23. Some bus lines 18 may be programmably connected to input lines 20 of generic logic blocks 12.

An EEPROM cell array (not shown) is used to provide programmable interconnections and signal routing in global routing pool 16. The EEPROM cell array also provides various other programmable interconnections throughout programmable logic device 10, as will be described more fully below.

In this example, global routing pool 16 is not fully populated. Thus, not every bus line 18 has a programmable interconnection to every input line 20 of every generic logic block 12. This reduces the number of EEPROM cells required for global routing pool 16, and also increases the switching speed of bus lines 18 in global routing pool 16.

Programmable logic device 10 may be used to perform logic operations on binary logic input signals to produce output signals. For example, programmable logic device may be programmed to solve the following simple equation:

$$X = A\hat{x}B\hat{x}C \oplus A\hat{x}B\hat{x}D \oplus D\hat{x}E \quad (1)$$

In equation (1), A, B, C, D and E are input signals received by programmable logic device 10 and X is an output signal produced by programmable logic device 10. The symbol ⊕ denotes an OR operation and x̂ denotes an AND operation. Thus, "Ax̂Bx̂C" is a combination of the A, B and C input signals in an AND operation. This type of AND grouping will be referred to herein as a product term.

Referring to FIG. 2, a block diagram of an exemplary generic logic block 12 is shown. Generic logic block 12 is, as the name implies, representative of all generic logic blocks 12 in programmable logic device 10.

Generic logic block 12 has a programmable AND array 24 with 165 AND gates 28. AND array 24 receives inputs 26 from an AND array input fuse pattern. The input fuse pattern establishes programmable interconnections between AND array input lines 26 and bus lines 18 in global routing pool 16. The bus lines 18 in global routing pool 16 may be output lines from I/O cells 14 or from other generic logic blocks 12, as previously discussed.

Within AND array 24, the signal on each input line 26 is provided in both inverted and noninverted forms on bus lines 27 by a line driver circuit 29 in accordance with the present invention. Each AND gate 28 has a set of input lines 30 providing input to the AND gate 28. Each input line 30 has a programmable interconnection (not explicitly shown) to each bus line 27 in AND array 24. Thus, AND array 24 is said to be fully populated.

The programmable interconnections in AND array 24, and throughout programmable logic device 10, may be provided by any known programmable interconnect cell. For example, a "Non-Volatile Erasable and Programmable Interconnect Cell" is disclosed in U.S. Pat. No. 5,251,169, issued to Gregg Josephson on May 6, 1991, which is incorporated herein by reference. Such interconnect cells may be part of the previously discussed EEPROM cell array in programmable logic device 10. Alternatively, the programmable interconnections in programmable logic device 10, also known as "fuses," may be SRAM cells, metal fuses, or other known types of programmable interconnections.

AND array 24 produces 165 AND gate outputs, also known as product term outputs 32. AND gates 28 are generally grouped into sets of five AND gates each. Each set of AND gates 28 is assigned to a corresponding macrocell 34. Generic logic block 12 includes 32 macrocells 34. In macrocells 34, product term outputs 32 may be selectively combined in one or more OR operations to provide a macrocell logic output signal. This output signal may be fed back to another generic logic block 12 for further logic operations, or may be provided as an output signal for programmable logic device 10.

Further details regarding the structure and function of programmable logic device 10 are provided in pending U.S. patent application Ser. No. 09/083,205, Attorney Docket No. M-5845 US, entitled "Programmable Logic Device," filed May 21, 1998, which is incorporated herein by reference.

Referring to FIG. 3, a schematic diagram of an exemplary line driver circuit 40 in accordance with the present invention is shown. Line driver circuit 40 may be implemented in programmable logic device 10 as a line driver circuit 29 in AND array 24. Alternatively, line driver circuit 40 may be advantageously implemented in any programmable logic array, programmable logic device, or other logic circuit in which a line driver circuit with direct and complementary outputs is required.

Line driver circuit 40 receives a logic INPUT signal from an input signal source 42. Input signal source 42 may be, for example, an AND array input line 26 shown in FIG. 2. Line driver circuit 40 also receives an ENABLE signal from an enable signal source 44. Line driver circuit 40 drives a direct output signal on a first output line 46, and a complementary output signal on a second output line 48.

The ENABLE signal from enable signal source 44 is supplied to a pass gate 50. Pass gate 50 includes a p-channel field effect transistor (FET) 50a with a source connected to a voltage source ($V_{CC}$), a gate connected to enable signal source 44, and a drain connected to an output node 50c. Pass gate 50 also includes an n-channel FET 50b with a drain connected to output node 50c, a gate connected to enable signal source 44, and a source connected to input signal source 42. Thus, when the ENABLE signal is LOW, output node 50c is connected via FET 50a to $V_{CC}$. Output node 50c therefore carries a HIGH signal when the ENABLE signal is LOW. When the ENABLE signal is HIGH, output node 50c is connected via FET 50b to input signal source 42. Output node 50c therefore carries the INPUT signal when the ENABLE signal is HIGH.

Output node 50c of pass gate 50 is connected to inverters 52 and 54. Inverter 52 has a p-channel FET 52a with a source connected to the voltage source ($V_{CC}$), a gate connected to output node 50c of pass gate 50, and a drain connected to an output node 52c. Inverter 52 also includes an n-channel FET 52b with a drain connected to output node 52c, a gate connected to input signal source 42, and a source connected to ground.

Likewise, inverter 54 has a p-channel FET 54a with a source connected to the voltage source ($V_{CC}$), a gate connected to output node 50c of pass gate 50, and a drain connected to an output node 54c. Inverter 54 also includes an n-channel FET 54b with a drain connected to output node 54c, a gate connected to input signal source 42, and a source connected to ground.

Inverters 52 and 54 are identical in structure and therefore behave identically. When the ENABLE signal is HIGH, pass gate output node 50c carries the INPUT signal from input signal source 42. Thus, the INPUT signal is received at the gates of both transistors 52a and 52b of inverter 52, and at the gates of transistors 54a and 54b of inverter 54. In this case, inverters 52 and 54 operate as conventional inverters, inverting the INPUT signal at their respective output nodes 52c and 54c.

When the ENABLE signal is LOW, pass gate output node 50c is HIGH, turning off transistors 52a and 54a. Transistors 52b and 54b turn on or off depending on the INPUT signal from input signal source 42. However, when the ENABLE signal is LOW, output nodes 52c and 54c are grounded regardless of the INPUT signal, as will be described below.

Output node 50c of pass gate 50 is connected to the gates of two n-channel grounding FETs 56 and 58. Each grounding FET 56 or 58 has a drain connected to a respective output node 52c or 54c of a respective inverter 52 or 54, and a source connected to ground. If the ENABLE signal is LOW (or if the INPUT signal is HIGH) then pass gate output node 50c is HIGH, and FETs 56 and 58 are turned on, grounding output nodes 52c and 54c of inverters 52 and 54. Thus, when the ENABLE signal is LOW, output line 46 is HIGH, while output line 48 is LOW.

In a sense, p-channel FET 52a and n-channel FET 56 together form an inverter that inverts the signal from output node 50c of pass gate 50. Thus, if the ENABLE signal is LOW, or if the INPUT signal is HIGH, then pass gate output node 50c is HIGH, and grounding FET 56 grounds output node 52c of inverter 52, whereas if the ENABLE signal is HIGH and the INPUT signal is LOW, then pass gate output node 50c is LOW, and FET 52a is on, generating a HIGH output at output node 52c.

Similarly. p-channel FET 54a and n-channel FET 58 form an inverter that inverts the signal from output node 50c of pass gate 50. Thus, if the ENABLE signal is LOW or the INPUT signal is HIGH, then grounding FET 58 grounds output node 54c of inverter 54, whereas if the ENABLE signal is HIGH and the INPUT signal is LOW, then FET 54a is on, generating a HIGH output at output node 54c.

Output node 54c of inverter 54 is connected to output line 48. Thus, the output of inverter 54 is provided as the complementary output signal of line driver circuit 40. Output node 52c of inverter 52 is inverted by an additional inverter 60, which drives output line 46. Thus, the output of inverter 60 is provided as the direct output signal of line driver circuit 40.

As previously stated, when the ENABLE signal is HIGH, line driver circuit 40 provides a complementary output on output line 48 and a direct output on output line 46. Thus, when the INPUT signal is LOW, output line 46 carries a LOW signal and output line 48 carries a HIGH signal. When the INPUT signal is HIGH, output line 46 carries a HIGH signal and output line 48 carries a LOW signal.

Line driver circuit 40 provides input signal latching and reinforcement through feedback FETs 62 and 64. Although feedback FETs 62 and 64 are not essential for practicing the present invention, these transistors provide latching and reinforcement that may be desirable in some circumstances.

For example, signal reinforcement may desirable in line driver circuit 40 when both the ENABLE and INPUT signals are HIGH. In this situation, transistor 50b of pass gate 50 conducts the HIGH INPUT signal to output node 50c. However, transistor 50b introduces a voltage drop approximately equal to the n-channel FET turn-on voltage ($V_{tn}$, in this case approximately one volt) between the HIGH INPUT signal and output node 50c. Thus, when both the ENABLE and INPUT signals are HIGH, the output of pass gate 50c, without reinforcement, would be approximately $V_{tn}$ below $V_{CC}$. This condition may cause current to be conducted by transistors 52a and 54a, thereby causing an undesirable increase in power consumption for line driver circuit 40.

INPUT signal latching may also be desirable for line driver circuit 40 because input signal source 42 might under some circumstances have a floating output. In this situation, it is desirable for line driver circuit 40 to latch the INPUT signal, to prevent the INPUT signal from floating either negative or positive.

Feedback FET 62 is a p-channel FET with a gate connected to output line 48, a source connected to a voltage supply ($V_{CC}$), and a drain connected to output node 50c of pass gate 50. Feedback FET 64 is an n-channel MOSFET with a gate connected to output line 48, a drain connected to input signal source 42, and a grounded source.

When the ENABLE signal is HIGH and the INPUT signal is HIGH, output node 50c of pass gate 50 is HIGH ($V_{CC}$–$V_{tn}$), causing output line 48 to be LOW. Feedback FET 62 is therefore turned on, resulting in output node 50c of pass gate 50 being pulled completely HIGH (i.e. to $V_{CC}$) via feedback FET 62. As previously described, this signal reinforcement reduces or eliminates any undesirable power consumption by transistors 52a and 54a.

When the ENABLE signal is HIGH and the INPUT signal is LOW, output line 48 is HIGH, turning on feedback FET 64. The LOW INPUT signal state is therefore latched by an additional connection to ground through feedback FET 64.

This latching prevents the INPUT signal from floating negative, even when the output of input signal source 42 ceases to be driven external to line drive circuit 40.

Although feedback FETs 62 and 64 are shown with their gates connected to node 54c, it will be understood that the gates of FETs 62 and 64 may alternatively be connected to node 52c without affecting the feedback principles described above.

From the foregoing description, it will be understood that when line driver circuit 40 is enabled, pass gate 50 introduces a delay in INPUT signal propagation through line driver circuit 40. This delay is primarily caused by the parasitic capacitance on output node 50c of pass gate 50, which reduces the switching speed of the INPUT signal at output node 50c. The predominant source of such parasitic capacitance is the transistor gates connected to output node 50c. Thus, the gates of FETs 52a, 54a, 56 and 58 contribute to the signal propagation delay through line driver circuit 40, whereas FETs 52b and 54b are driven directly by input signal source 12.

However, only those transistors which are involved in output signal switching must be large enough to provide high-speed signal switching. Other transistors involved in maintaining an existing output signal state may be as small as the design rule for the device allows. Thus, for example, transistors 50a, 56 and 58, which maintain a steady output signal state when the ENABLE signal is LOW, may be small transistors. The remaining transistors in line driver circuit 40 are preferably larger transistors, to conduct larger currents and provide high-speed output signal switching.

Thus, transistors 56 and 58, which have gates connected to output node 50c of pass gate 50, contribute only a small amount of parasitic capacitance to output node 50c because of their small size. Most of the parasitic capacitance is created by the gates of larger transistors 52a and 54a.

This is in contrast to an alternative, more conventional pass gate configuration, in which transistor 50b is placed directly in the INPUT signal line from input signal source 42 to inverters 52 and 54. In this alternative configuration, the ENABLE signal is provided to the gate of transistor 50b, so that the INPUT signal is provided to inverters 52 and 54 when the ENABLE signal is HIGH. In this configuration, the INPUT signal passing through transistor 50b has parasitic capacitance contributions from the gates of four large transistors 52a, 52b, 54a and 54b. This large parasitic capacitance causes a delay in turning on transistors 52a, 52b, 54a and 54b.

In contrast, line driver circuit 10 as illustrated in FIG. 3 has an INPUT signal with parasitic capacitance contributions from two large transistors 52a and 54a and two small transistors 56 and 58. This smaller parasitic capacitance reduces the delay in turning on transistors 52a and 54a. Furthermore, in line driver circuit 10 there is no delay in turning on transistors 52b and 54b. Thus, line driver circuit 10 as illustrated in FIG. 3 has higher output signal switching speed than conventional line driver circuits.

It should be noted that, in the alternative line driver circuit configuration described above, the need for transistors 50a, 56 and 58 would be eliminated, thereby reducing the physical area required for line driver circuit 10. However, because transistors 50a, 56 and 58 may be as small as the device design rule allows, the additional area required for these transistors is very small. Thus, line driver circuit 10 as illustrated in FIG. 3 provides a higher switching speed than conventional line driver circuits with only a minimal addition to the physical area required for the circuit.

Although the present invention and its advantages have been described in detail, it should be understood that various changes, substitutions, and alterations can be made therein without departing from the spirit and scope of the invention as defined by the appended claims.

I claim:

1. A line driver circuit for providing a complementary output signal on a first output line and a direct output signal on a second output line in response to an input signal, the line driver circuit comprising:

an input line operable to receive and conduct the input signal;

a first inverter having first and second input terminals and an output terminal coupled to the first output line, the first input terminal being connected directly to the input line of the line driver circuit;

a second inverter having an output node coupled to the second output line;

a third inverter having first and second input terminals and an output terminal coupled to an input node of the second inverter, the first input terminal of the third inverter being connected directly to the input line of the line driver circuit;

a pass gate having first and second input terminals and an output terminal, the second input terminal being coupled to the input line of the line driver circuit, the output terminal of the pass gate being coupled to the second input terminal of the first inverter and the second input terminal of the third inverter, the pass gate being operable to receive an enable signal at the first input terminal, and operable to provide a conduction path between the input line of the line driver circuit and the output terminal of the pass gate in response to a first state of the enable signal;

wherein the first and third inverters are each operable to invert the input signal to generate an output signal in response to the pass gate providing a conduction path between the input line of the line driver circuit and the output terminal of the pass gate, and wherein the second inverter is operable to invert the output signal of the third inverter to generate the direct output signal.

2. The line driver circuit of claim 1, wherein the first inverter comprises:

a first transistor having a first terminal coupled to the first input terminal of the first inverter, the first transistor further having a second terminal coupled to the output terminal of the first inverter, the first transistor further having a third terminal coupled to a first reference voltage source; and a second transistor having a first terminal coupled to the second input terminal of the first inverter, the second transistor further having a second terminal coupled to the output terminal of the first inverter, the second transistor further having a third terminal coupled to a second reference voltage source.

3. The line driver circuit of claim 1, wherein the third inverter comprises:

a first transistor having a first terminal coupled to the first input terminal of the third inverter, the first transistor further having a second terminal coupled to the output terminal of the third inverter, the first transistor further having a third terminal coupled to the first reference voltage source; and a second transistor having a first terminal coupled to the second input terminal of the third inverter, the second transistor further having a second terminal coupled to the output terminal of the third inverter, the second transistor further having a third terminal coupled to the second reference voltage source.

4. The line driver circuit of claim 1, wherein the pass gate comprises a disabling transistor having first, second and third terminals, the second terminal being coupled to a reference voltage source, the third terminal being coupled to the output terminal of the pass gate, the disabling transistor being operable to receive the enable signal at the first terminal of the disabling transistor, and operable to provide a conduction path between the reference voltage source and the output terminal of the pass gate in response to a second state of the enable signal.

5. The line driver circuit of claim 1, further comprising:

a first grounding transistor having a first terminal coupled to the third terminal of the disabling transistor, the first grounding transistor further having a second terminal coupled to a second reference voltage source, the first grounding transistor further having a third terminal coupled to the first output line, the first grounding transistor being operable to provide a conduction path between the second reference voltage source and the first output line in response to the disabling transistor providing a conduction path between the reference voltage source and the output terminal of the pass gate; and a second grounding transistor having a first terminal coupled to the third terminal of the disabling transistor, the second grounding transistor further having a second terminal coupled to a third reference voltage source, the second grounding transistor further having a third terminal coupled to a selected one of the second output line and the input node of the second inverter, the second grounding transistor being operable to provide a conduction path between the third reference voltage source and the selected one of the second output line and the input node of the second inverter in response to the disabling transistor providing a conduction path between the reference voltage source and the output terminal of the pass gate.

6. The line driver circuit of claim 1, wherein each of the transistors of the line driver circuit comprises a field effect transistor.

7. The line driver circuit of claim 1, wherein the pass gate comprises a field effect transistor, and wherein the first terminal of the pass gate comprises a gate terminal of the field effect transistor coupled to an enable signal source.

8. The line driver circuit of claim 1, further comprising an input signal feedback circuit comprising:

a first field effect transistor having a gate coupled to the first output line of the line driver circuit, the first field effect transistor having a first terminal coupled to a first reference voltage source and a second terminal coupled to the second input terminal of the first inverter; and a second field effect transistor having a gate coupled to the first output line of the line driver circuit, the second field effect transistor having a first terminal coupled to a second reference voltage source and a second terminal coupled to the first input terminal of the first inverter.

9. A method for driving logic signals on first and second output lines in response to an input signal and an enable signal, comprising:

receiving the enable signal at a first input terminal of a pass gate;

receiving the input signal at a second input terminal of the pass gate;

providing the input signal as an output signal of the pass gate in response to a first state of the enable signal;

receiving the input signal at a first input terminal of a first inverter;

receiving the output signal of the pass gate at a second input terminal of the first inverter;

inverting the input signal by the first inverter in response to the pass gate providing the input signal as the output signal of the pass gate;

providing the inverted input signal by the first inverter as a first output signal on the first output line;

receiving the input signal at a first input terminal of a second inverter;

receiving the output signal of the pass gate at a second input terminal of the second inverter;

inverting the input signal by the second inverter to generate an output signal in response to the pass gate providing the input signal as the output signal of the pass gate;

receiving and inverting the output signal of the second inverter at a third inverter; and providing an output signal of the third inverter as a second output signal on the second output line.

10. The method of claim 9, further comprising:

providing a reference signal as the output signal of the pass gate in response to a second state of the enable signal receiving the output signal of the pass gate at a first disabling switch; and connecting the first output line to a reference voltage by the first grounding switch in response to the reference signal.

11. The method of claim 9, further comprising:

receiving the output signal of the pass gate at a second grounding switch; and connecting a reference voltage to a selected one of the second output line and an input terminal of the third inverter by the second grounding switch in response to the reference signal.

12. The method of claim 9, further comprising:

inverting the first output signal by a fourth inverter; and providing the inverted first output signal to the first and second input terminals of the first inverter to reinforce the input signal in response to the pass gate providing the input signal as the output signal of the pass gate.

13. A programmable logic array comprising:

a plurality of programmable logic array input lines;

a plurality of line driver circuits, each line driver circuit being associated with and connected to a respective one of the programmable logic array input lines, at least one of the line driver circuits having:

(a) a first inverter having first and second transistors and an output node coupled to the first output line, the second transistor having a first terminal connected directly to the programmable logic array input line associated with the line driver circuit, the first and second transistors each having a second terminal coupled to the output node of the first inverter;

(b) a second inverter having an output node coupled to the second output line;

(c) a third inverter having first and second transistors and an output node coupled to an input node of the second inverter, the second transistor having a first terminal connected directly to the programmable logic array input line associated with the line driver circuit, the first and second transistors each having a second terminal coupled to the output node of the first inverter; and (d) a pass gate having first, second and third terminals, the second terminal being coupled to the programmable logic array input line associated with the line driver circuit, the third terminal being coupled to a first terminal of the first transistor of the first inverter and a first terminal of the first transistor of the third inverter, the pass gate being operable to receive an enable signal at the first terminal, and operable to provide a conduction path between the second and third terminals in response to a first state of the enable signal;

wherein the first inverter is operable to invert the input signal to generate an output signal in response to the pass gate providing a conduction path between the second and third terminals of the pass gate, and wherein the third inverter is operable to invert the input signal to generate an output signal in response to the pass gate providing a conduction path between the second and third terminals of the pass gate, and wherein the second inverter is operable to invert the output signal of the third inverter;

a plurality of logic gates, each logic gate having a plurality of input lines; and a plurality of programmable interconnections, each programmable interconnection being operable to programmably connect a selected one of the output lines of a selected one of the line driver circuits with a selected one of the input lines of a selected one of the logic gates.

14. The programmable logic array of claim 13, wherein the first inverter of the at least one line driver circuit comprises:

a first transistor having a first terminal coupled to the first input terminal of the first inverter, the first transistor further having a second terminal coupled to the output terminal of the first inverter, the first transistor further having a third terminal coupled to a first reference voltage source; and a second transistor having a first terminal coupled to the second input terminal of the first inverter, the second transistor further having a second terminal coupled to the output terminal of the first inverter, the second transistor further having a third terminal coupled to a second reference voltage source.

15. The programmable logic array of claim 13, wherein the third inverter of the at least one line driver circuit comprises:

a first transistor having a first terminal coupled to the first input terminal of the third inverter, the first transistor further having a second terminal coupled to the output terminal of the third inverter, the first transistor further having a third terminal coupled to the first reference voltage source; and a second transistor having a first terminal coupled to the second input terminal of the third inverter, the second transistor further having a second terminal coupled to the output terminal of the third inverter, the second transistor further having a third terminal coupled to the second reference voltage source.

16. The programmable logic array of claim 13, wherein the pass gate of the at least one line driver circuit comprises a disabling transistor having first, second and third terminals, the second terminal being coupled to a reference voltage source, the third terminal being coupled to the output terminal of the pass gate, the disabling transistor being operable to receive the enable signal at the first terminal of the disabling transistor, and operable to provide a conduction path between the reference voltage source and the output terminal of the pass gate in response to a second state of the enable signal.

17. The programmable logic array of claim 13, wherein the at least one line driver circuit further comprises:

a first grounding transistor having a first terminal coupled to the third terminal of the disabling transistor, the first grounding transistor further having a second terminal coupled to a second reference voltage source, the first grounding transistor further having a third terminal coupled to the first output line, the first grounding transistor being operable to provide a conduction path between the second reference voltage source and the first output line in response to the disabling transistor providing a conduction path between the reference voltage source and the output terminal of the pass gate; and a second grounding transistor having a first terminal coupled to the third terminal of the disabling transistor, the second grounding transistor further having a second terminal coupled to a third reference voltage source, the second grounding transistor further having a third terminal coupled to a selected one of the second output line and the input node of the second inverter, the second grounding transistor being operable to provide a conduction path between the third reference voltage source and the selected one of the second output line and the input node of the second inverter in response to the disabling transistor providing a conduction path between the reference voltage source and the output terminal of the pass gate.

18. The programmable logic array of claim 13, wherein each of the transistors of the at least one line driver circuit comprises a field effect transistor.

19. The programmable logic array of claim 13, wherein the pass gate of the at least one line driver circuit comprises a field effect transistor, and wherein the first terminal of the pass gate comprises a gate terminal of the field effect transistor coupled to an enable signal source.

20. The line driver circuit of claim 13, wherein the at least one line driver circuit further comprises an input signal feedback circuit including:

a first field effect transistor having a gate coupled to the first output line of the line driver circuit, the first field effect transistor having a first terminal coupled to a first reference voltage source and a second terminal coupled to the second input terminal of the first inverter; and a second field effect transistor having a gate coupled to the first output line of the line driver circuit, the second field effect transistor having a first terminal coupled to a second reference voltage source and a second terminal coupled to the first input terminal of the first inverter.

* * * * *

UNITED STATES PATENT AND TRADEMARK OFFICE
CERTIFICATE OF CORRECTION

PATENT NO. : 6,087,854
DATED : July 11, 2000
INVENTOR(S) : Potter

Page 1 of 1

It is certified that error appears in the above-identified patent and that said Letters Patent is hereby corrected as shown below:

Column 3,
Line 3, delete printed equation and insert -- $X = A \otimes B \otimes C \otimes A \otimes B \otimes D \otimes D \otimes E$ --;

Line 7, delete " $\hat{x}$ " and insert -- $\otimes$ --;

Line 8, delete "A $\hat{X}$ B $\hat{X}$ C" and insert -- $A \otimes B \otimes C$ --;

Lines 56-57, delete ", Attorney Docket No. M-5845 US,"; and

Column 5,
Line 31, after "may" insert -- be --.

Signed and Sealed this

Fifth Day of November, 2002

*Attest:*

JAMES E. ROGAN
*Director of the United States Patent and Trademark Office*

*Attesting Officer*